(12) United States Patent
Cogoni et al.

(10) Patent No.: US 12,051,681 B2
(45) Date of Patent: Jul. 30, 2024

(54) VOLTAGE REGULATING DEVICE

(71) Applicants: STMICROELECTRONICS (GRENOBLE 2) SAS, Grenoble (FR); STMICROELECTRONICS (ALPS) SAS, Grenoble (FR)

(72) Inventors: Deborah Cogoni, Notre Dame de l'Osier (FR); David Auchere, Meylan (FR); Laurent Schwartz, La Buisse (FR); Claire Laporte, Grenoble (FR)

(73) Assignees: STMICROELECTRONICS (GRENOBLE 2) SAS, Grenoble (FR); STMICROELECTRONICS (ALPS) SAS, Grenoble (FR)

( * ) Notice: Subject to any disclaimer, the term of this patent is extended or adjusted under 35 U.S.C. 154(b) by 140 days.

(21) Appl. No.: 17/374,868

(22) Filed: Jul. 13, 2021

(65) Prior Publication Data
US 2022/0028844 A1 Jan. 27, 2022

(30) Foreign Application Priority Data
Jul. 27, 2020 (FR) ...................................... 2007922

(51) Int. Cl.
*H01L 25/16* (2023.01)
*H01G 4/38* (2006.01)

(52) U.S. Cl.
CPC ........... *H01L 25/165* (2013.01); *H01G 4/385* (2013.01)

(58) Field of Classification Search
CPC ... H01L 25/165; H01L 23/552; H01L 23/642; H01L 2224/16225; H01L 2924/15311; H01L 2924/16152; H01L 25/16; H01L 23/10; H01L 23/50; H01G 4/385
See application file for complete search history.

(56) References Cited

U.S. PATENT DOCUMENTS

| 2014/0291782 | A1* | 10/2014 | Goh ...................... B81B 7/0058 |
| | | | 438/109 |
| 2016/0285462 | A1* | 9/2016 | Takamuku .............. H03L 1/022 |
| 2020/0194542 | A1 | 6/2020 | Alapati |

FOREIGN PATENT DOCUMENTS

| CN | 202616238 U | * | 12/2012 |
| FR | 3087578 A1 | | 4/2020 |
| JP | H0865051 A | * | 3/1996 |
| JP | H09306950 A | * | 11/1997 |
| JP | 2003526209 A | * | 9/2003 |
| JP | 2004266013 A | * | 9/2004 |
| JP | 2011030124 A | * | 2/2011 |
| JP | 2020178016 A | * | 10/2020 |

* cited by examiner

*Primary Examiner* — Michael Lebentritt
(74) *Attorney, Agent, or Firm* — Seed IP Law Group LLP

(57) ABSTRACT

A device for regulating a voltage of an electric current supplying an integrated circuit resting on a substrate. The integrated circuit comprises a ground terminal and a power supply terminal able to receive the electric current. The regulation device comprises a first cover covering the integrated circuit, a second cover covering the integrated circuit. The first cover is electrically connected to the power supply terminal of the integrated circuit. The second cover is electrically connected to the ground terminal of the integrated circuit. The first cover and the second cover are connected together by a capacitive connection.

19 Claims, 15 Drawing Sheets

VOLTAGE REGULATING DEVICE

BACKGROUND

Technical Field

The present disclosure relates to, generally, devices that make it possible to regulate the voltage at the current power supply terminals of an integrated circuit. The disclosure relates in particular to the power supply with current of an integrated circuit fastened on a substrate.

Description of the Related Art

In the framework of power supplies of an integrated circuit (also known as "Die") it is necessary to place one or more capacitances, in parallel with the current power supply terminals of this integrated circuit.

These capacitances make it possible to prevent voltage drops in the power supply current, these drops being generated by the fast and short increases over time in the intensity of the current demanded by the integrated circuit. These voltage drops in the power supply current would indeed hinder the operation of the integrated circuit. These capacitances make it possible to store energy and then in the case of an increase in the intensity of the current demanded, they make it possible to restore this energy and thus prevent a drop in the voltage of the current. These capacitances therefore make it possible to carry out a function of regulating the voltage of the power supply current, because thanks to these capacitances the voltage of the power supply current will remain constant even during an increase in the intensity of the current demanded by the integrated circuit.

These capacitances thus used are known under the expression "decoupling capacitance" as they make it possible to decouple the variations in the intensity of the current demanded by the integrated circuit of a possible drop in the voltage of this current supplying the integrated circuit.

These capacitances generally take the form of capacitors of different types:
  chemical for increases in the intensity of the current that have a low frequency. (these chemical capacitors have a capacitance of about 10 µF)
  "film" for increases in the intensity of the current that have a medium frequency. (these film capacitors have a capacitance of about 0.1 µF)
  ceramic for increases in the intensity of the current that have a high frequency. (these ceramic capacitors have a capacitance of about 100 pF)

It is known to fasten the integrated circuit on a substrate. This fastening is generally carried out by brazing at metal connectors of the integrated circuit and of the substrate. The brazing of two metal parts is a permanent assembly method that establishes a metallic connection between the parts joined together. Contrary to welding, there is no melting of the assembled parts. According to the cases there may or may not be use of a filler metal. Brazing also allows for the electrical connection between the two parts joined together. This substrate of the prior art is shown in FIG. 1. This substrate SUB comprises an alternation of conductive layers CC (generally made from copper) and insulating layers CI. The insulating layers CI are generally of the polyepoxide type (also known as epoxide polymers or "epoxy") with or without the addition of glass fiber (e.g., FR4). The substrate SUB also comprises two external layers CE (one external layer per face of the substrate). These external layers CE are also known under the expression of Solder Mask. These are insulating layers formed generally from a polymer. These external layers CE are used to protect the copper on the external layers of the substrate SUB. Openings O, in these external layers CE, make it possible to expose certain copper zones and thus carry out metal interconnections with exterior elements (for example the integrated circuit, other components, covers, metal connectors to connect the substrate to a printed circuit on which the substrate rests). The brazing of the integrated circuit CInt on the substrate SUB is generally carried out at these openings O.

FIG. 2 shows a substrate SUB of the prior art on which an integrated circuit CInt is fastened. A metal cover Cap is also fastened on this substrate SUB. These fastenings are generally carried out by brazing. The substrate SUB also comprises metal connectors CONNECT.

FIGS. 3-a to 3-c show the location in the devices of the prior art of the decoupling capacitances of the capacitor COND type on the substrate. The zones ZINT of the substrate on which the placing of the components is prohibited are also shown, in particular where it is not possible to place these capacitors COND. These prohibited zones are constraint zones linked to the assembly of the different elements of the substrate. Most often the chip and the cover. The chip is generally glued to the substrate, this glue overflows onto the sides and creates a zone wherein it is not possible to place components. The cover bears against a zone of the substrate wherein it is also impossible to place components. Finally, there is the zone of the substrate on which the integrated circuit CInt is fastened and which cannot receive components other than this integrated circuit CInt.

It appears that the space on the substrate that can receive components in particular capacitors used to regulate the voltage of the power supply current may not be sufficient in certain configurations.

BRIEF SUMMARY

The present disclosure is directed to a new type of device for regulating a voltage of a power supply current of an integrated circuit, comprising an arrangement of capacitances required to regulate the voltage of the power supply current of the integrated circuit adapted to the space constraints on the substrate on which the integrated circuit is fastened.

The disclosure makes it possible to overcome the aforementioned disadvantages by proposing a device for regulating a voltage of an electric current supplying an integrated circuit resting on a substrate. The integrated circuit comprises a ground terminal and a power supply terminal able to receive the electric current. The regulation device comprises a first cover covering the integrated circuit, a second cover covering the integrated circuit. The first cover is electrically connected to the power supply terminal of the integrated circuit. The second cover is electrically connected to the ground terminal of the integrated circuit. The first cover and the second cover are connected together by a capacitive connection.

This device offers the advantage of being able to use the space that is located at the covers covering the integrated circuit to be able to carry out a capacitive connection between the power supply terminals of the integrated circuit. This connection makes it possible to store the energy then to restore it in the case where a peak in the intensity of the current demanded by the integrated circuit would cause a drop in the voltage that is supplying this integrated circuit and therefore to regulate the voltage of the power supply current of the integrated circuit.

In an embodiment, an upper portion of the first cover and an upper portion of the second cover are located on the same plane substantially parallel to the substrate. The upper portion of the first cover is a portion of the first cover that is the farthest away from the substrate and the upper portion of the second cover is a portion of the second cover that is the farthest away from the substrate (SUB).

In an embodiment, the second cover is placed between the first cover and the substrate.

In an embodiment, the first cover is fastened to the substrate on two first zones located at the edge of two parallel sides of the substrate and the second cover is fastened to the substrate on two second zones located at the edge of the two other sides of the substrate.

In an embodiment, the first cover is fastened to the substrate on four first zones located at the edge of the four sides of the substrate (SUB) and the second cover is fastened to the substrate on four second zones located between the integrated circuit and the fastening zones of the first cover.

In an embodiment, the capacitive connection comprises a dielectric material.

In an embodiment, the capacitive connection comprises a plurality of capacitors of the surface-mounted component type.

In an embodiment, a first terminal of each capacitor is electrically connected with only one of the covers among the first cover or the second cover and a second terminal of each capacitor is electrically connected with only the other cover among the first cover or the second cover.

In an embodiment, the capacitors are assembled with the first cover and the second cover by carrying out:
- a step of depositing at least one first zone of electrically conductive adhesive paste on an external face of the first cover;
- a step of depositing at least one first zone of electrically non-conductive adhesive paste on the first cover;
- a step of positioning capacitors on the first cover in such a way that the first terminals of the capacitors are positioned on the zone of electrically conductive adhesive paste and that the second terminals of the capacitors are positioned on the zone of electrically non-conductive adhesive paste;
- a step of depositing at least one second zone of electrically conductive adhesive paste on an internal face of the second cover;
- a step of depositing at least one second zone of electrically non-conductive adhesive paste on the internal face of the second cover;
- a step of positioning the second cover above the first cover in such a way that the second zone of electrically non-conductive adhesive paste is in contact with the first terminals of the capacitors and the second zone of electrically conductive adhesive paste is in contact with the second terminals of the capacitors.

In an embodiment, the device is supplied by two voltages. The integrated circuit comprises a first power supply terminal and a second power supply terminal. The device comprises a first cover covering at least partially the integrated circuit, a second cover covering at least partially the integrated circuit, a third cover covering at least partially the integrated circuit. The first cover is electrically connected to the first power supply terminal of the integrated circuit. The second cover is electrically connected to the ground terminal of the integrated circuit. The third cover is electrically connected to the second power supply terminal of the integrated circuit. The first cover and the second cover are connected together by a first capacitive connection. The second cover and the third cover are connected together by a second capacitive connection.

In an embodiment, an upper portion of the first cover, an upper portion of the second cover and an upper portion of the third cover are located on the same plane substantially parallel to the substrate or an upper portion of the first cover and an upper portion of the third cover are located on the same plane substantially parallel to the substrate and the first cover and the third cover are placed between the substrate and the second cover. The upper portion of the first cover is a portion of the first cover that is the farthest away from the substrate. The upper portion of the second cover is a portion of the second cover that is the farthest away from the substrate. The upper portion of the third cover is a portion of the third cover that is the farthest away from the substrate.

In an embodiment, the first capacitive connection comprises a first plurality of first capacitors of the surface-mounted component type. The second capacitive connection comprises a second plurality of second capacitors of the surface-mounted component type. A first terminal of each first capacitor is electrically connected with only one of the covers among the first cover or the second cover. A second terminal of each first capacitor is electrically connected with only the other cover among the first cover or the second cover. A first terminal of each second capacitor is electrically connected with only one of the covers among the second cover or the third cover. A second terminal of each second capacitor is electrically connected with only the other cover among the second cover or the third cover.

According to another aspect, an assembly is proposed comprising a substrate, an integrated circuit and device for regulating a voltage of an electric current supplying the integrated circuit.

BRIEF DESCRIPTION OF THE SEVERAL VIEWS OF THE DRAWINGS

Other characteristics, purposes and advantages of the disclosure shall appear in the following description, which is purely for the purposes of illustration and is not limiting, and which must be read with regards to the accompanying drawings wherein:

FIG. 4-b shows a second embodiment of the device according to the disclosure.

DETAILED DESCRIPTION DISCLOSURE

Figure 1:
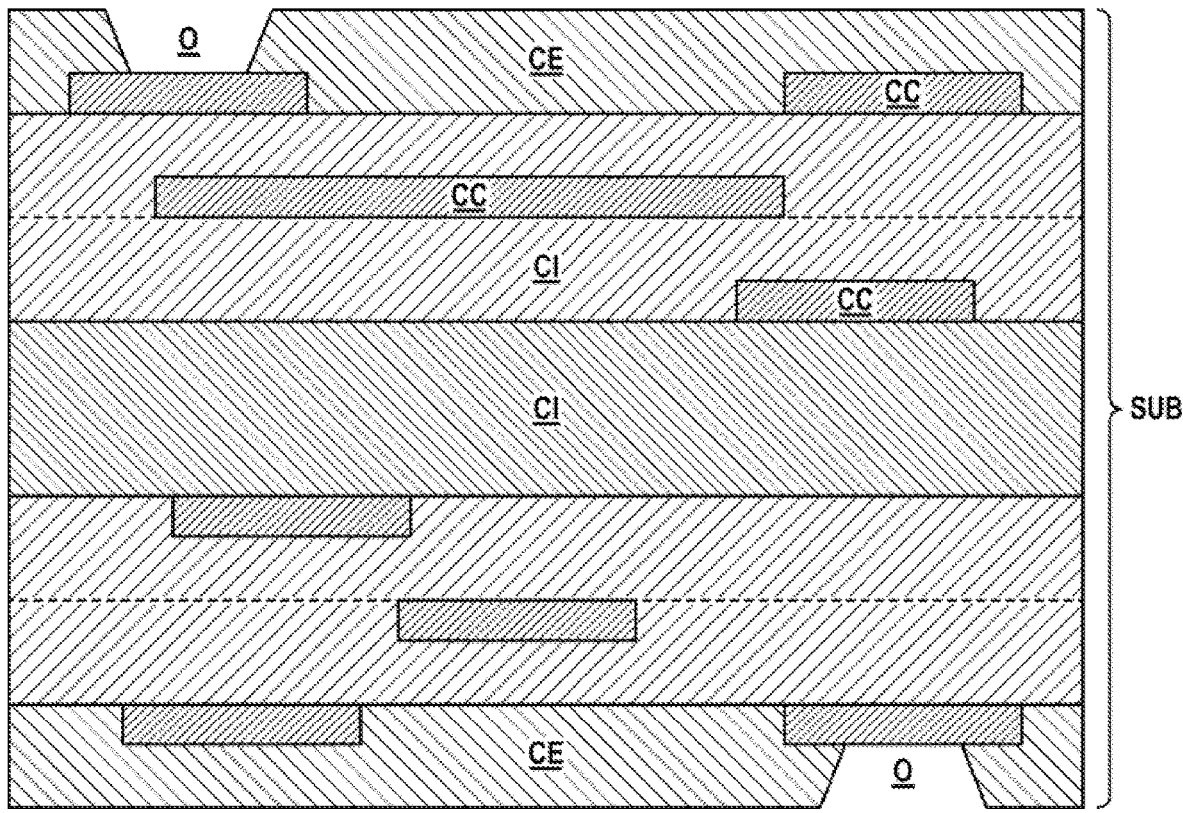
FIG. 1 shows in a first way the substrate according to the prior art, on which the integrated circuit is fastened.
Figure 2:
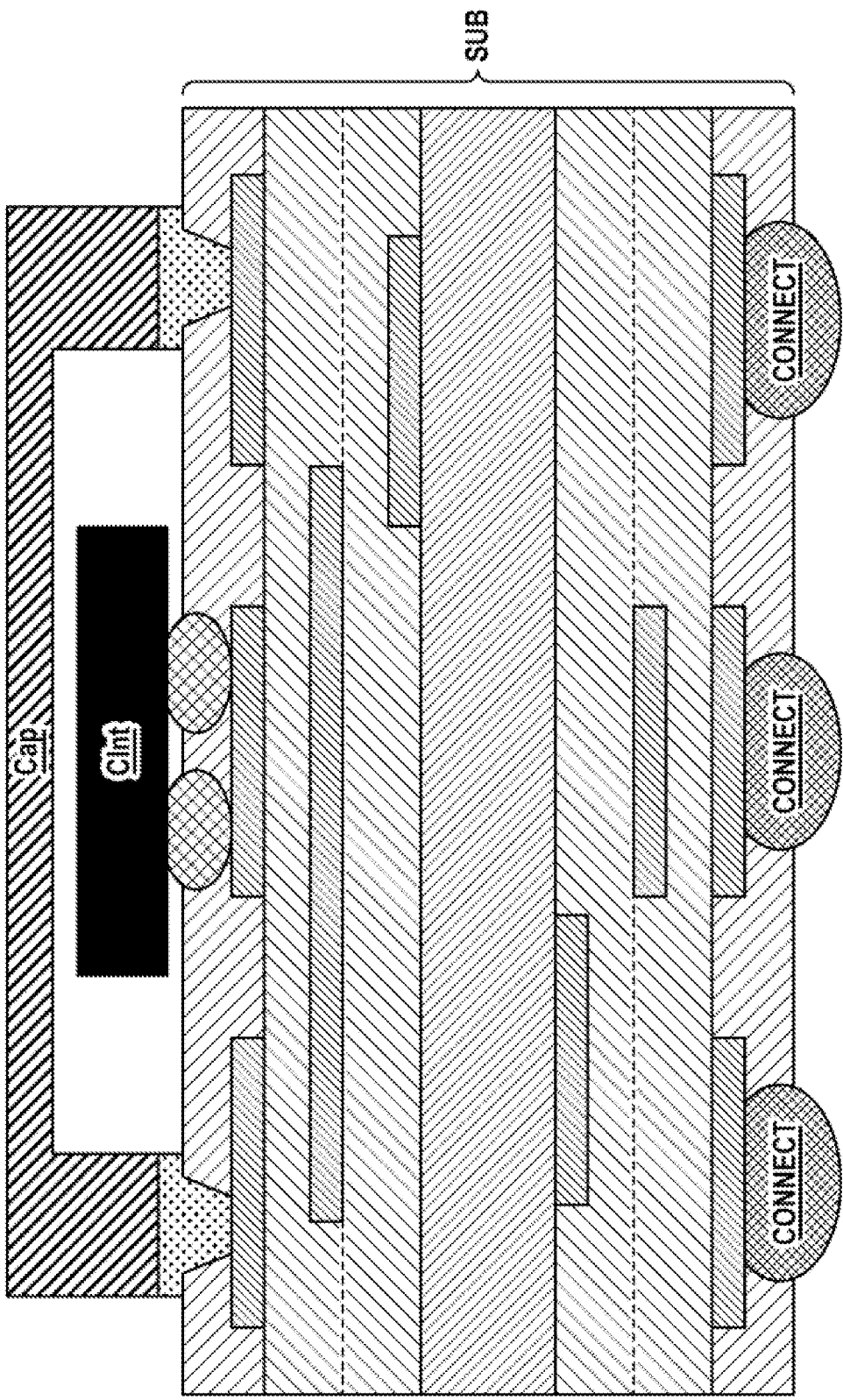
FIG. 2 shows in a second way the substrate according to the prior art, on which the integrated circuit is fastened.
Figure 3A:
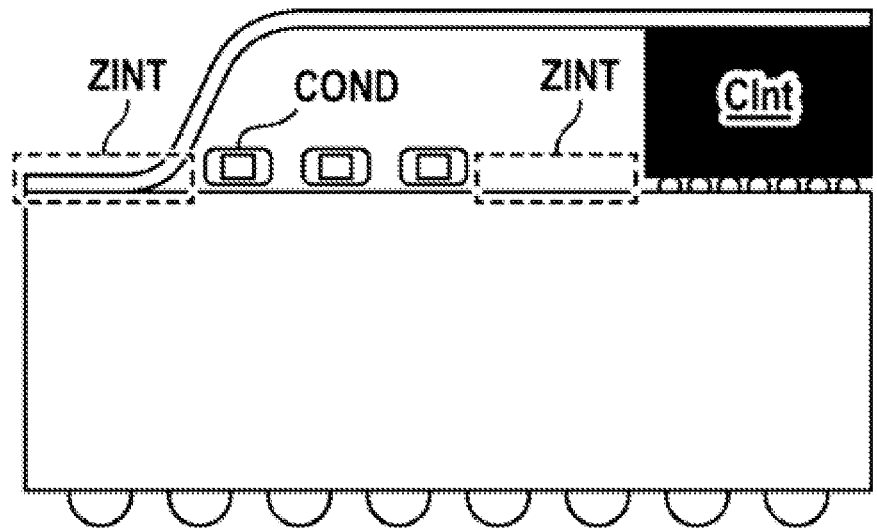
FIGS. 3-a to 3-c show the usual zones, such as defined in the prior art, of the substrate on which it is possible and prohibited to place components.
Figure 3B:
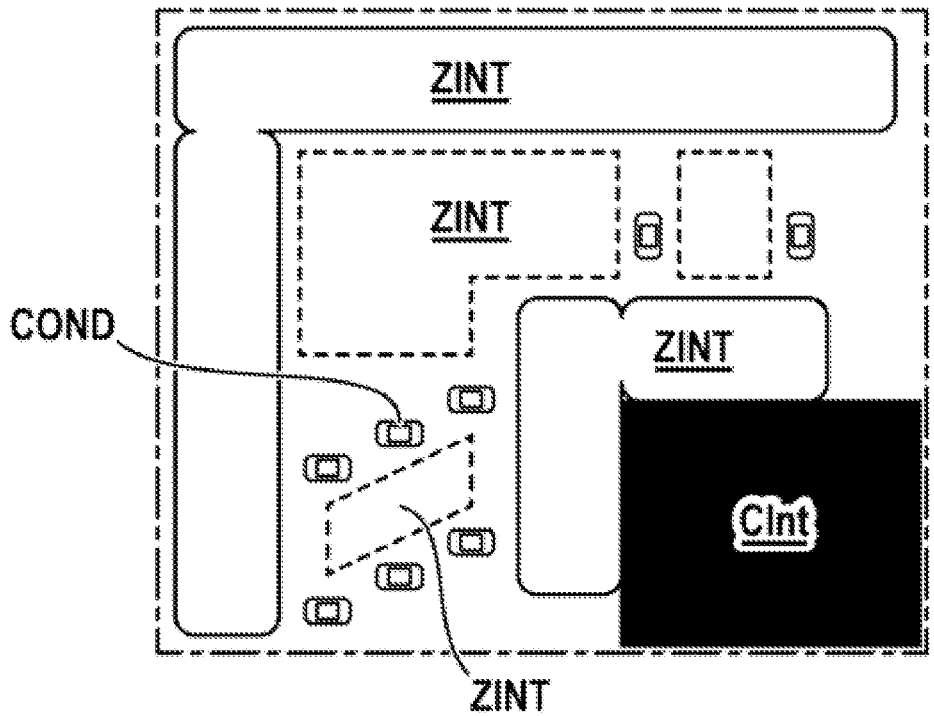
Figure 3C:
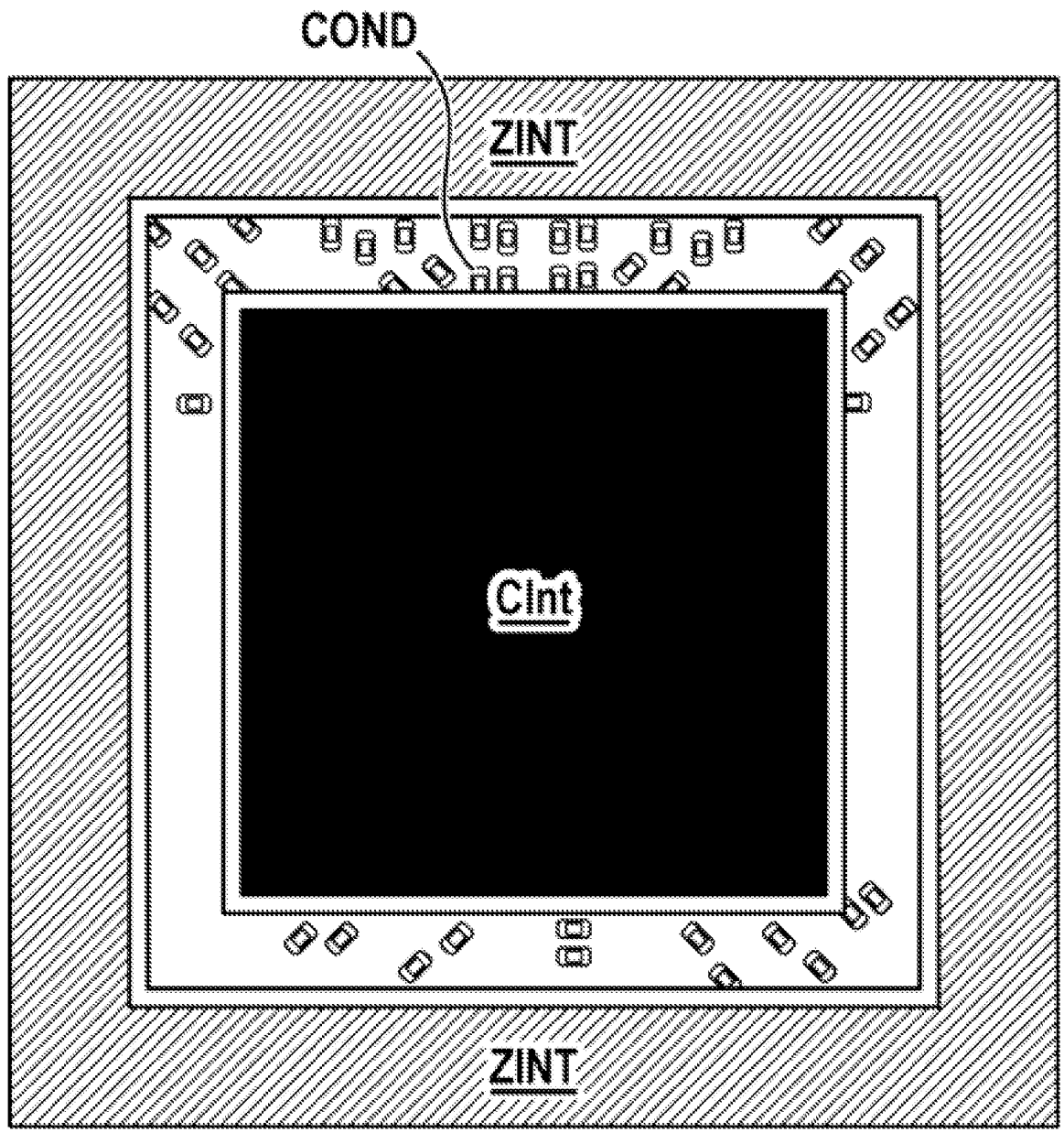
Figure 4A:
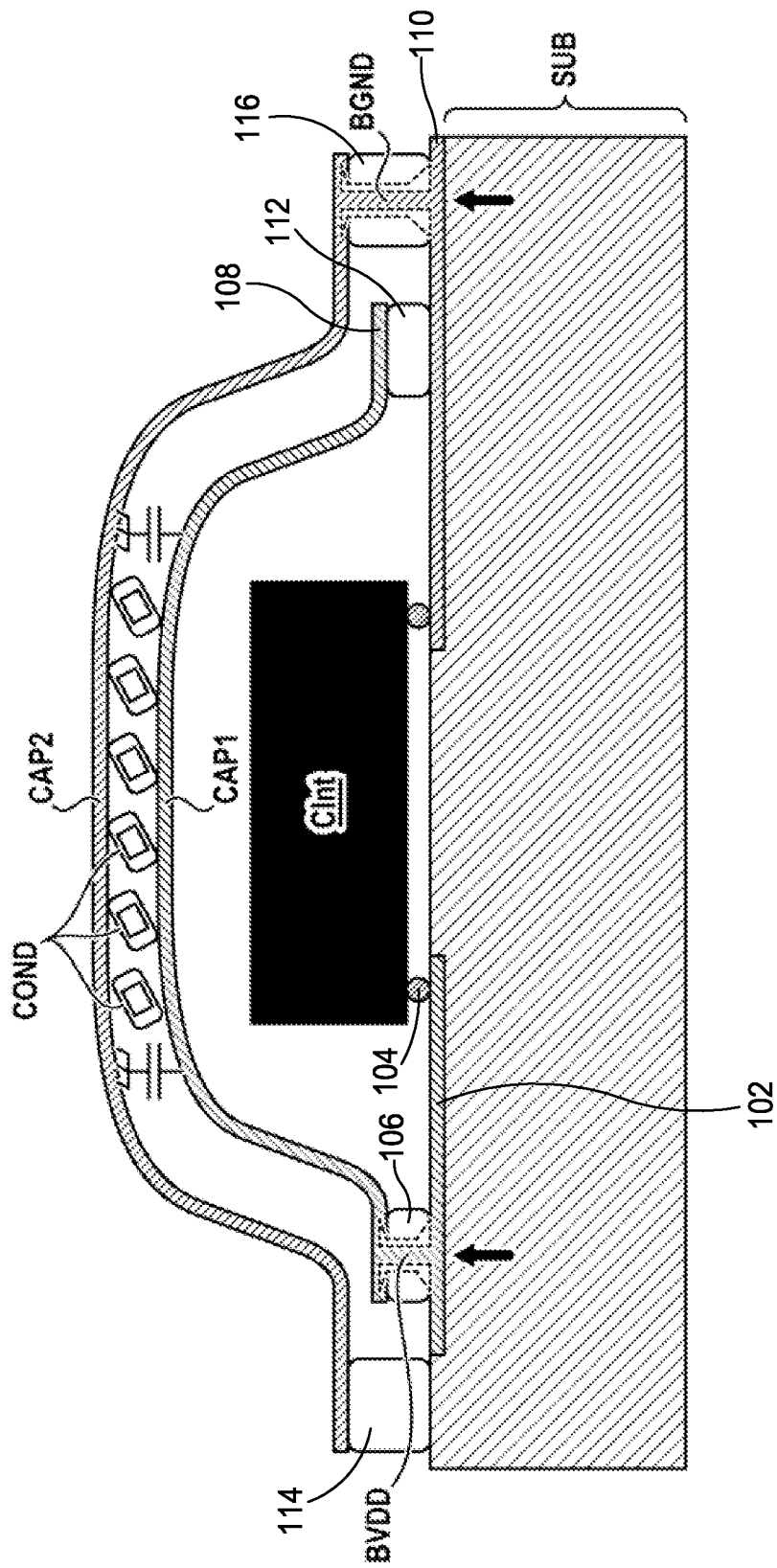
FIG. 4-a shows a first embodiment of the device according to the disclosure.
Figure 4B:
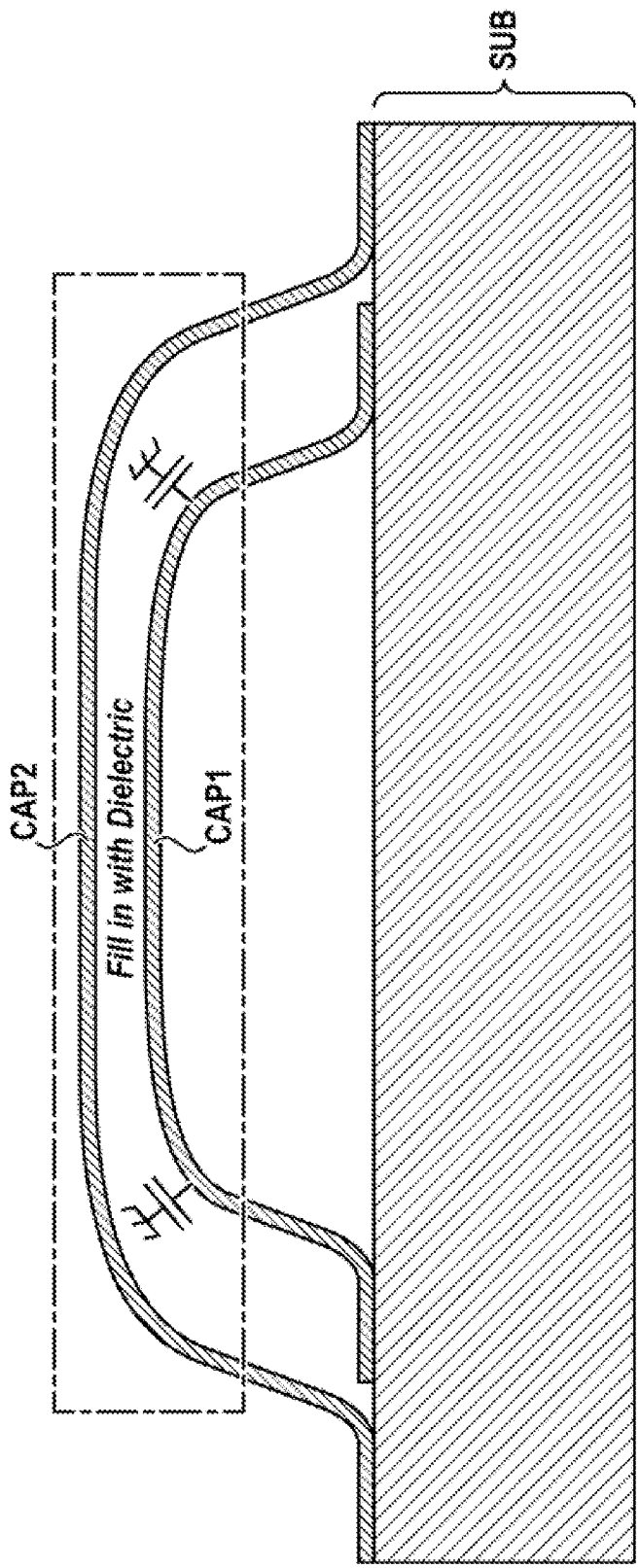

FIG. 4-*a* shows a first embodiment of the device according to the disclosure, that makes it possible to regulate the voltage at the current power supply terminals of an integrated circuit CInt.

In FIG. 4-*a* the integrated circuit CInt is fastened, for example by brazing, on a substrate SUB.

A first cover CAP1 and a second cover CAP2 are placed above the integrated circuit CInt and cover it.

The first cover CAP1 and the second cover CAP2 are made of metal. The first cover CAP1 and second cover CAP2 are electrically insulated from one another.

Two metallic elements are electrically insulated if they are physically linked by a material that prevents the passage of an electric current between the two elements when the latter are subjected to a difference in electric potential. This material that prevents the passage of an electric current is qualified as a dielectric material. Air is an example of dielectric material.

The first cover CAP1 and the second cover CAP2 are fastened for example by brazing to the substrate SUB.

The first cover CAP1 is electrically connected to a power supply terminal BVDD of the integrated circuit CInt receiving a first electric potential VDD1 from an electric current power supply (not shown in FIG. 4-*a*). The connection between the integrated circuit and the first cover CAP1 is carried out by a power supply plane present on the substrate. This power supply plane also usually makes it possible to connect the power supply of the integrated circuit CInt to another exterior device, for example to a board that supports the integrated circuit CInt (also known under the expression motherboard). The connection between the first cover CAP1 and the power supply plane is done by brazing, or by gluing with a conductive glue. The power supply plane is connected to the integrated circuit CInt by the use of metal connectors that allow for a surface mounting, these metal connectors also known under the expression "bump."

Two metallic elements are electrically connected if they are physically connected by a material that allows for the passage of an electric current between the two elements when the latter are subjected to a difference in electric potential. Metals generally allow for the passage of an electric current. It is known to use copper to electrically connect two metal elements.

The second cover CAP2 is electrically connected to a ground terminal BGND of the integrated circuit CInt. The ground terminal BGND of the integrated circuit CInt is connected to the ground of the electric current power supply.

The first electric potential VDD1 makes it possible to deliver a first voltage between the power supply terminal BVDD and the ground BGND.

The first cover CAP1 and the second cover CAP2 are connected together by a capacitive connection.

The capacitive connection can be carried out in several different ways.

In the embodiment of FIG. 4-*a* this capacitive connection comprises a plurality of capacitors COND of the surface-mounted component type.

The surface-mounted components (SMD) are electric components that can be brazed directly on the surface of the support on which they are fastened without having to pass pins through this support. In the embodiment of FIG. 4-*a*, the support is the first cover CAP1 or the second cover CAP2.

The arrangement between the first cover CAP1 and the second cover CAP2 of the device allows for:

the electrical insulation between the first cover CAP1 and the second cover CAP2; and the realization of the capacitive connection between the first cover CAP1 and the second cover CAP2.

In the embodiment shown in FIG. 4-*a* the first cover CAP1 and the second cover CAP2 are substantially parallel to each other. This parallelism between the first cover CAP1 and the second cover CAP2 is optional. Other arrangements of the first cover CAP1 and of the second cover CAP2 are possible.

The first cover or lid CAP1 is coupled at least one point to a contact pad 102 on the substrate SUB, which is also coupled to the integrated circuit or die CInt by an electrical connection 104, such as a solder ball. The contact pad is coupled to the cover CAP1 through BVDD, which is an electrical connection through a dielectric support or adhesive structure 106. Other ends 108 of the cover CAP1 are spaced from another contact pad 110 by another dielectric support 112.

The second cover or lid CAP2 is spaced from the substrate by a dielectric support 114. The cover CAP2 is electrically coupled to the contact pad 110 through BGDN, which extends through a dielectric support 116. The integrated circuit is also coupled to the contact pad 110 through electrical connection 118.

FIG. 4-*b* shows a second embodiment of the device according to the disclosure. The device according to this embodiment is identical to that of the embodiment shown in FIG. 4-*b*, except for the capacitive connection between the first cover CAP1 and the second cover CAP2.

In the embodiment shown in FIG. 4-*b* the capacitive connection is carried out by a dielectric material. This dielectric material is for example a material with a polytetrafluoroethylene (PTFE), ceramic or epoxy base. It is also known to use, air, a vacuum, Teflon, silicon dioxide, FR4, etc.

This dielectric material fills the space between the first cover CAP1 and the second cover CAP2. This dielectric material is in physical contact with the first cover CAP1 and the second cover CAP2.

Figure 5:
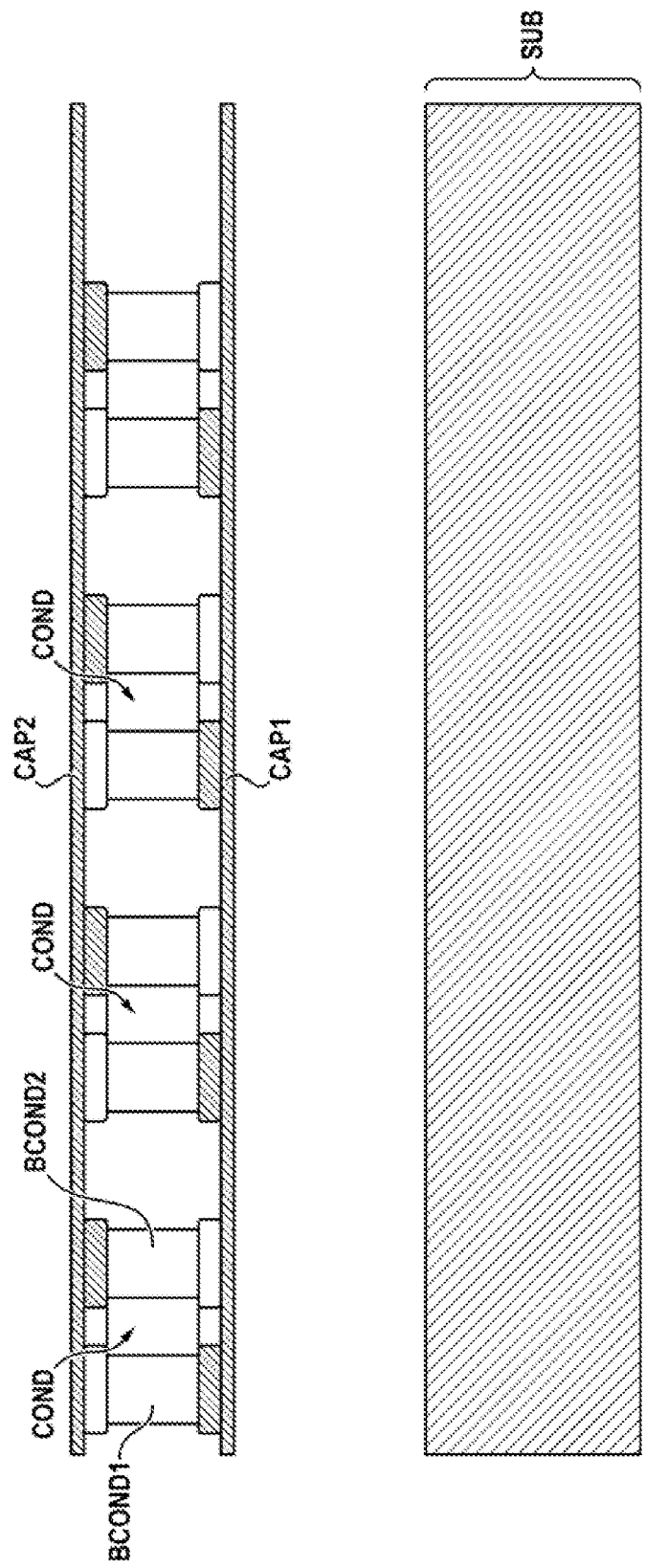
FIG. 5 shows an embodiment of the mounting that can be implemented in the disclosure, capacitors between the first cover and the second cover.

FIG. 5 shows an embodiment of the capacitive connection that can be implemented in the disclosure, between the first cover CAP1 and the second cover CAP2.

Likewise in the embodiments shown in FIGS. 4-*a* and 4-*b*, in this embodiment of the capacitive connection, the first cover CAP1 is placed between the substrate SUB and the second cover CAP2.

The capacitors COND are positioned substantially parallel to the first cover CAP1 and to the second cover CAP2.

A first terminal BCOND1 of each capacitor COND is electrically connected only to the first cover CAP1.

A second terminal BCOND2 of each capacitor COND is electrically connected only to the second cover CAP2.

Figure 6:
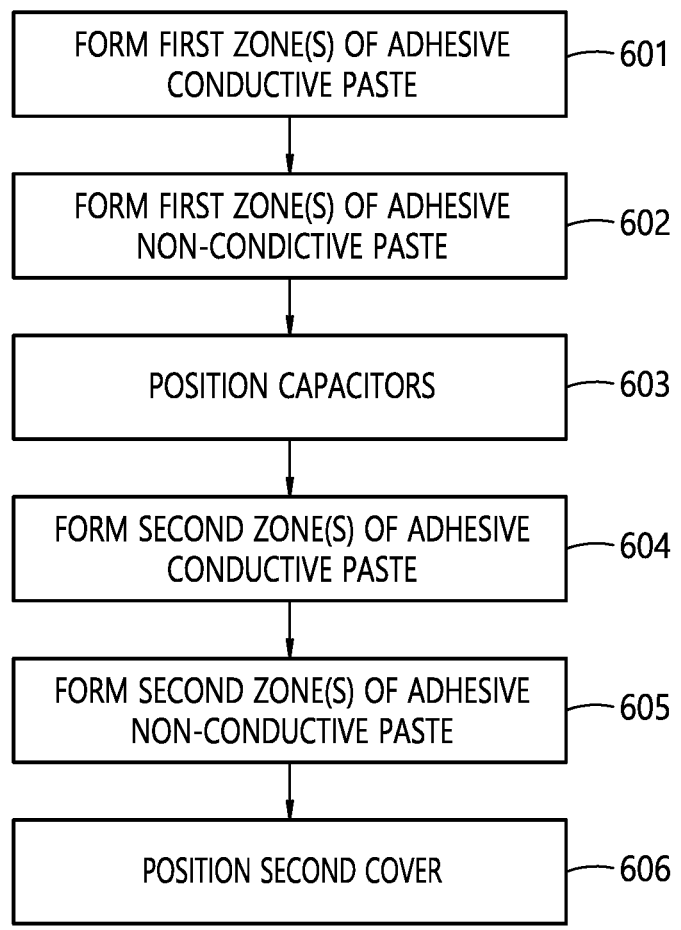
FIG. 6 shows a method for assembling that can be implemented in the disclosure, capacitors between the first cover and the second cover.

This is carried out for example the implementing of a method of assembly, shown in FIG. 6, this method comprises the following steps:
- a step 601 of depositing one (or several) first(s) zone(s) PCE1 of electrically conductive adhesive paste on an external face of the first cover CAP1;
- a step 602 of depositing one (or several) first(s) zone(s) PNCE1 of electrically non-conductive adhesive paste on the first cover CAP1;
- a step 603 of positioning capacitors COND on the first cover CAP1 in such a way that the first terminals BCOND1 of the capacitors COND are in contact with the first zone(s) PCE1 of electrically conductive adhesive paste and that the second terminals BCOND2 of the capacitors COND are in contact with the first zone(s) PNCE1 of electrically non-conductive adhesive paste;
- a step 604 of depositing one (or several) second zone(s) PCE2 of electrically conductive adhesive paste on an internal face of the second cover CAP2;
- a step 605 of depositing one (or several) second zone(s) PNCE2 of electrically non-conductive adhesive paste on the internal face of the second cover CAP2, and
- a step 606 of positioning the second cover CAP2 above the first cover CAP1 in such a way that the second zone(s) PNCE2 of electrically non-conductive adhesive paste is (are) in contact with the first terminals BCOND1 of the capacitors COND and the second zone(s) PCE2 of the strip of electrically conductive adhesive paste is (are) in contact with the second BCOND2 of the capacitors COND.

The method can also comprise a step 607 of firing or heating the device of the disclosure. This firing or heating allows for the solidification of the connections between the covers, the pastes, and the capacitors.

It is advantageous that the first zones PCE1 of electrically conductive adhesive paste not be in contact with the second terminals BCOND2.

It is advantageous that the second zones PCE2 of electrically conductive adhesive paste not be in contact with the first terminals BCOND1.

It is possible that the first zones PNCE1 of electrically non-conductive adhesive paste be in partial contact with the first terminals BCOND1.

It is possible that the second zones PNCE2 of electrically non-conductive adhesive paste be in partial contact with the second terminals BCOND2

The second zones PNCE2 of electrically non-conductive adhesive paste are applied in such a way as to be in contact with the first terminals BCOND1 of the capacitors COND and the second zones PCE2 of electrically conductive adhesive paste are applied in such a way as to be in contact with the second terminals BCOND2 of the capacitors COND.

The first zones PCE1 of electrically conductive adhesive paste can be first strips of electrically conductive adhesive paste. The first zones PNCE1 of electrically non-conductive adhesive paste can be first strips of electrically non-conductive adhesive paste. The first strips of electrically conductive adhesive paste can be parallel to the first strips of electrically non-conductive adhesive paste and the distance between the first conductive and non-conductive strips is comprised between 95% and 105% of the distance between the first terminal BCOND1 of the capacitors COND and the second terminal BCOND2 of the capacitors COND, advantageously the distance between the first conductive and non-conductive strips is equal to the distance between the first terminal BCOND1 of the capacitors COND and the second terminal BCOND2 of the capacitors COND.

The second zones PCE1 of electrically conductive adhesive paste can be second strips of electrically conductive adhesive paste. The second zones PNCE1 of electrically non-conductive adhesive paste can be second strips of electrically non-conductive adhesive paste. The second strips of electrically conductive adhesive paste can be parallel to the second strips of electrically non-conductive adhesive paste and the distance between the second conductive and non-conductive strips is comprised between 95% and 105% of the distance between the first terminal BCOND1 of the capacitors COND and the second terminal BCOND2 of the capacitors COND, advantageously the distance between the second conductive and non-conductive strips is equal to the distance between the first terminal BCOND1 of the capacitors COND and the second terminal BCOND2 of the capacitors COND.

This method therefore makes it possible to fasten, via the use of adhesive paste, the first terminal BCOND1 and the second terminal BCOND2 of each capacitor COND to the first cover CAP1 and to the second cover CAP2.

This method makes it possible to electrically connect only the first terminal BCOND1 to the first cover CAP1. Indeed the fastening of the first terminal BCOND1 to the second cover CAP2 is carried out by an electrically non-conductive paste.

This method makes it possible to electrically connect only the second terminal BCOND2 to the second cover CAP2. Indeed the fastening of the second terminal BCOND2 to the first cover CAP1 is carried out by an electrically non-conductive paste.

Figure 7:
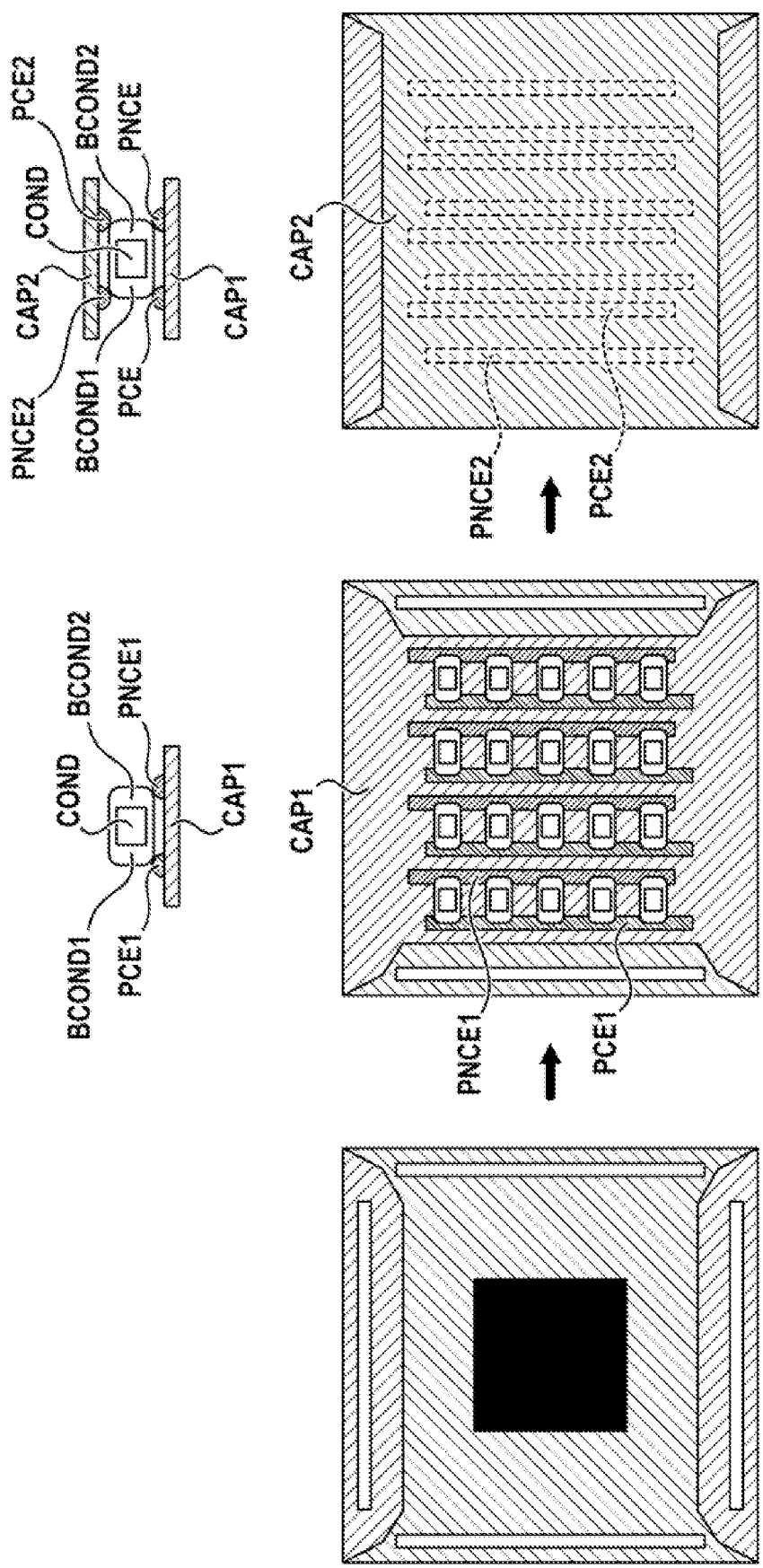
FIG. 7 shows in another way the method for assembling that can be implemented in the disclosure, capacitors between the first cover and the second cover.

FIG. 7 shows an example of the method for assembling shown in FIG. 6 and that can be implemented in the disclosure. The first and second zones of conductive and non-conductive paste may be staggered with respect to each other. The capacitors may be an array of rows and columns of capacitors positioned between the two covers.

Figure 8:
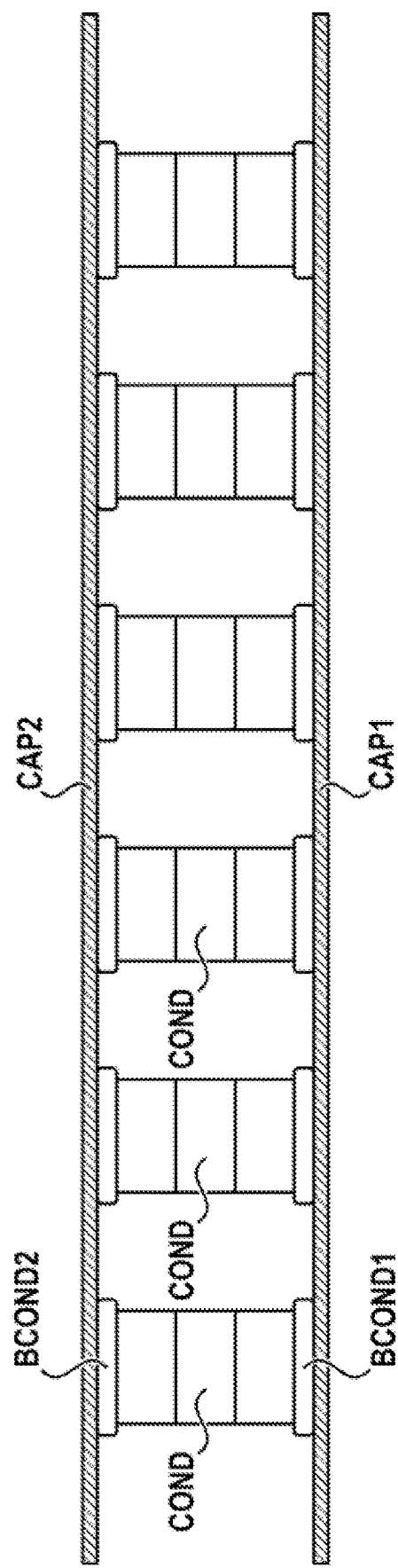
FIG. 8 shows another embodiment of the mounting that can be implemented in the disclosure, capacitors between the first cover and the second cover.

FIG. 8 shows another embodiment that can be implemented in the disclosure, of the mounting of the capacitors COND between the first cover CAP1 and the second cover CAP2 using conductive paste or brazing paste.

In this embodiment, the first terminals BCOND1 are exclusively in contact with the first cover CAP1 and the second terminals BCOND2 are exclusively in contact with the second cover CAP2

In these two embodiments of the capacitive connection, the first cover CAP1 and the second cover CAP2 are substantially parallel.

In this embodiment of the capacitive connection, a terminal (for example the first terminal BCOND1) of the capacitors COND is fastened and electrically connected only to and with the first cover CAP1.

The other terminal (for example the second terminal BCOND2) of the capacitors COND is fastened and electrically connected only to and with the second cover CAP2.

The fastening of the first terminals BCOND1 and of the second terminals BCOND2 of the capacitors COND on the first cover CAP1, and the second cover CAP2 respectively, can be carried out by brazing or with electrically conductive adhesive paste.

In the various embodiments of the disclosure the first cover CAP1 and the second cover CAP2 are fastened to the substrate SUB.

This fastening is carried out by example by brazing or with the electrically conductive adhesive paste.

This fastening of the first cover CAP1 and of the second cover CAP2 can be carried out in different ways.

Figure 9:
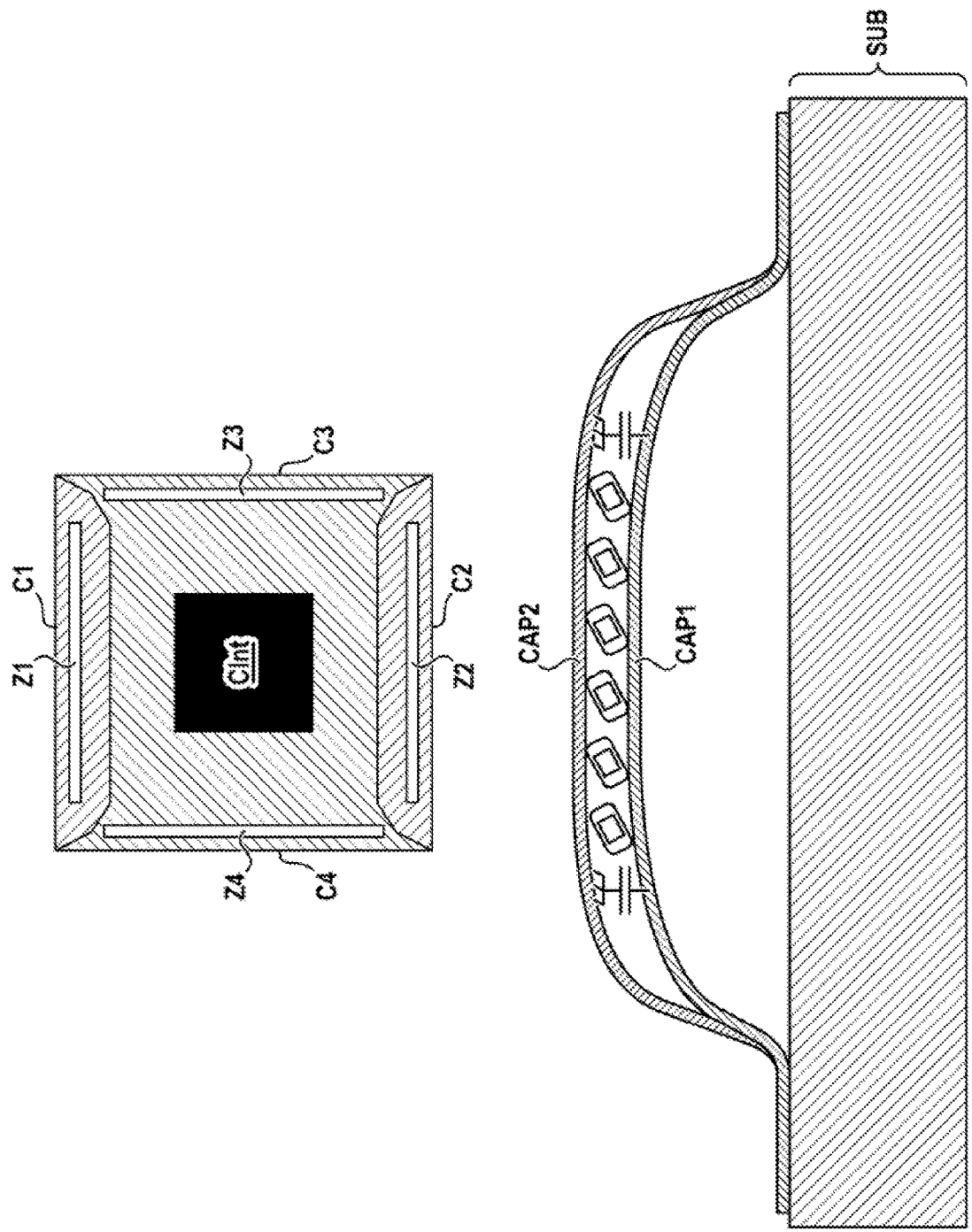
FIG. 9 shows an embodiment of the fastening that can be implemented in the disclosure, of the first cover and of the second cover on the substrate.

FIG. 9 shows an embodiment, that can be implemented in one of the embodiments of the disclosure, of the fastening of the first cover CAP1 and of the second cover CAP2 on the substrate SUB.

The first cover CAP1 is fastened to the substrate SUB on two first zones Z1 and Z2. The two first zones Z1 and Z2 are located in the vicinity of two first sides C1 and C2 parallel to the surface of the substrate SUB.

The second cover CAP2 is fastened to the substrate on two second zones Z3 and Z4. The two second zones Z3 and Z4 are located in the vicinity of two second sides C3 and C4 parallel to the surface of the substrate SUB and different from the two first sides C1 and C2.

Figure 10:
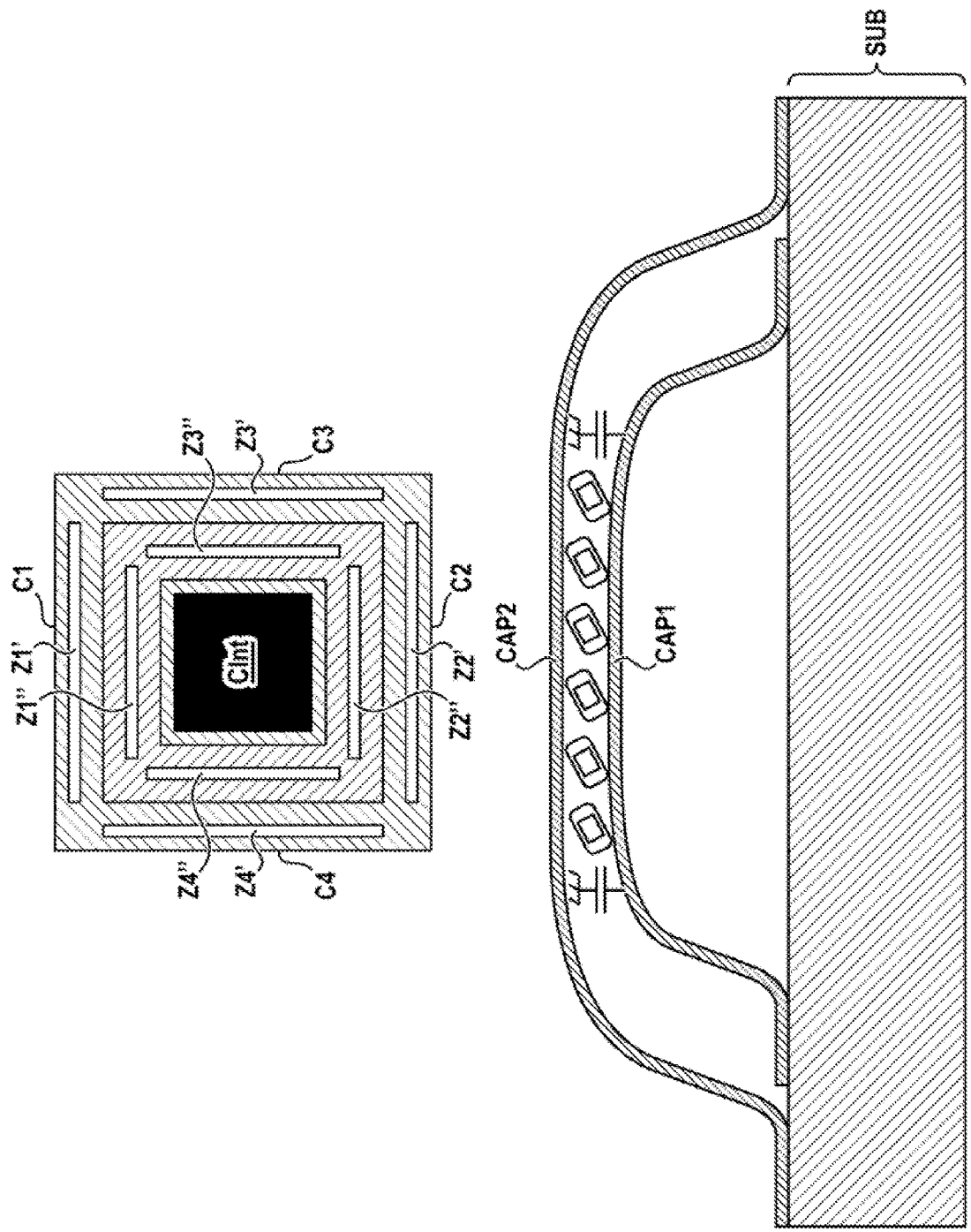
FIG. 10 shows another embodiment of the fastening that can be implemented in the disclosure, of the first cover and of the second cover on the substrate.

FIG. 10 shows another embodiment of the fastening of the first cover CAP1 and of the second cover CAP2 on the substrate SUB.

The second cover CAP2 is fastened to the substrate SUB on four first zones Z1' to Z4'. The four first zones Z1' to Z4' are located at the edge of the four sides C1 to C4 of the rectangle formed by the surface of the substrate SUB.

The first cover CAP1 is fastened on four second zones Z1" to Z4". The four second zones Z1" to Z4" are located between the four first zones Z1' to Z4' and the integrated circuit CInt.

In an embodiment of the fastening of covers, the substrate SUB forms a substantially rectangular or square plane. In this case the various fastening zones are located in the vicinity of the sides of the rectangular and square plane and parallel to these sides.

Figure 11:
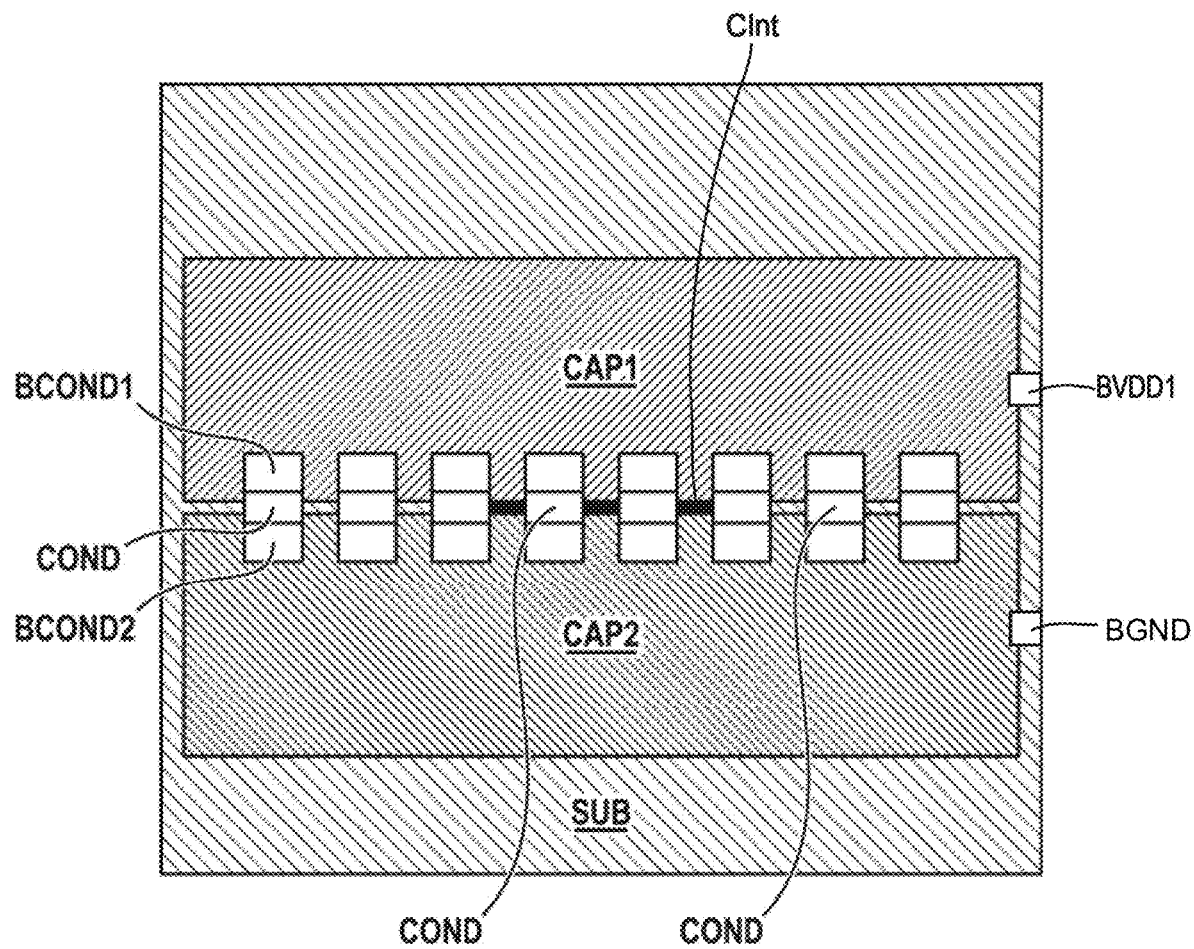
FIG. 11 shows an embodiment of the mounting that can be implemented in the disclosure, of the first cover and of the second cover on the substrate.

FIG. 11 shows an embodiment of the disclosure wherein the first cover CAP1 and the second cover CAP2 are mounted side-by-side.

The side-by-side mounting of the first cover CAP1 and the second cover CAP2 makes it possible to obtain a regulation device or an assembly comprising the substrate SUB the integrated circuit CInt and the device for a finer regulation than with other montages.

In this embodiment an upper portion of the first cover CAP1 and an upper portion of the second cover CAP2 are located on the same plane substantially parallel to the substrate SUB. The upper portion of the first cover CAP1 is a portion of the first cover CAP1 that is the farthest away from the substrate SUB. The upper portion of the second cover CAP2 is a portion of the second cover CAP2 that is the farthest away from the substrate SUB.

The first cover CAP1 and the second cover CAP2 are not electrically connected between them.

The first cover CAP1 and the second cover CAP2 are connected by a capacitive connection.

The capacitive connection comprises capacitors COND. A first terminal BCOND1 of the capacitors COND is connected to the first cover CAP1. A second terminal BCOND2 of the capacitors COND is connected to the second cover CAP2.

It is possible to connect the first terminal BCOND1 of the capacitors COND to the first cover CAP1 and the second terminal BCOND2 of the capacitors COND to the second cover CAP2 via the use of electrically conductive adhesive paste or by brazing.

Figure 12:
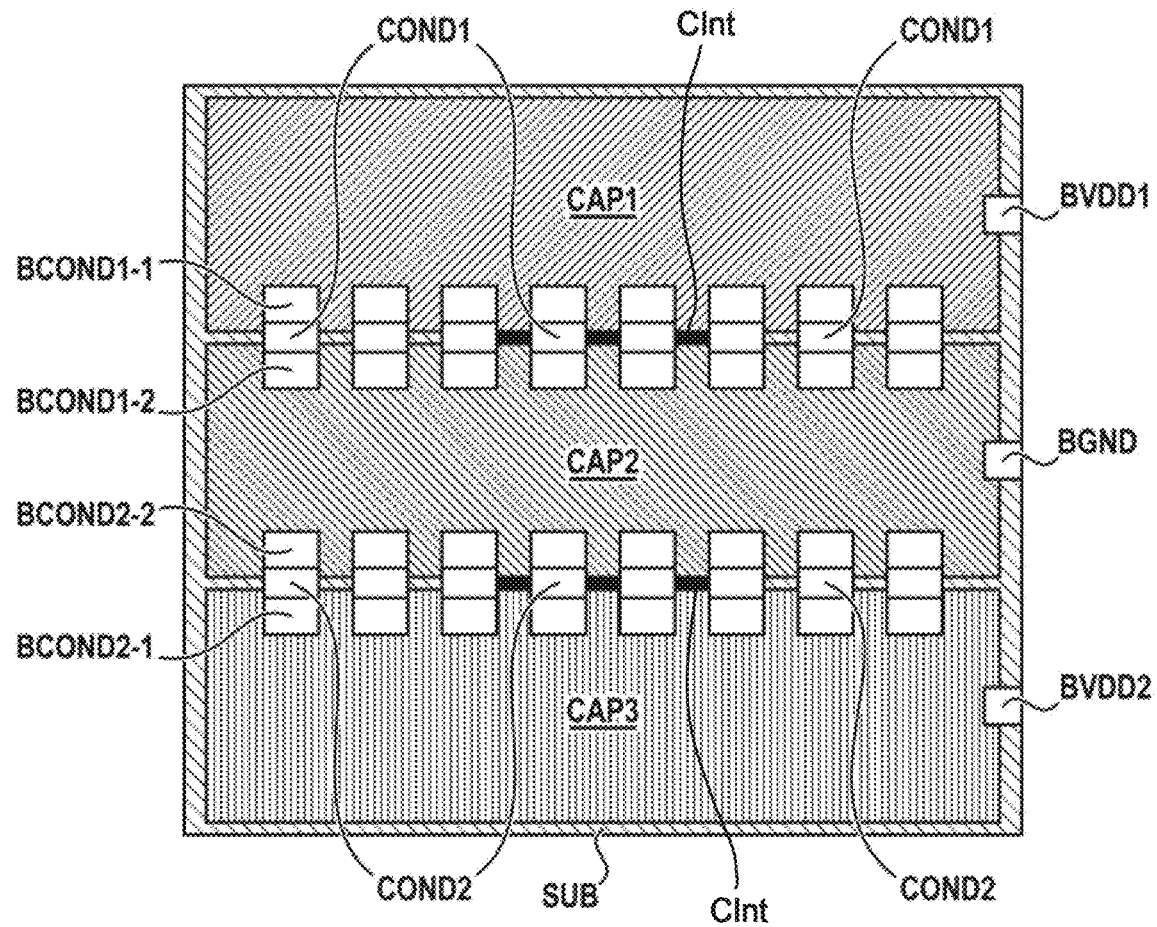
FIG. 12 shows an embodiment of the device according to the disclosure, comprising three covers.
Figure 13:
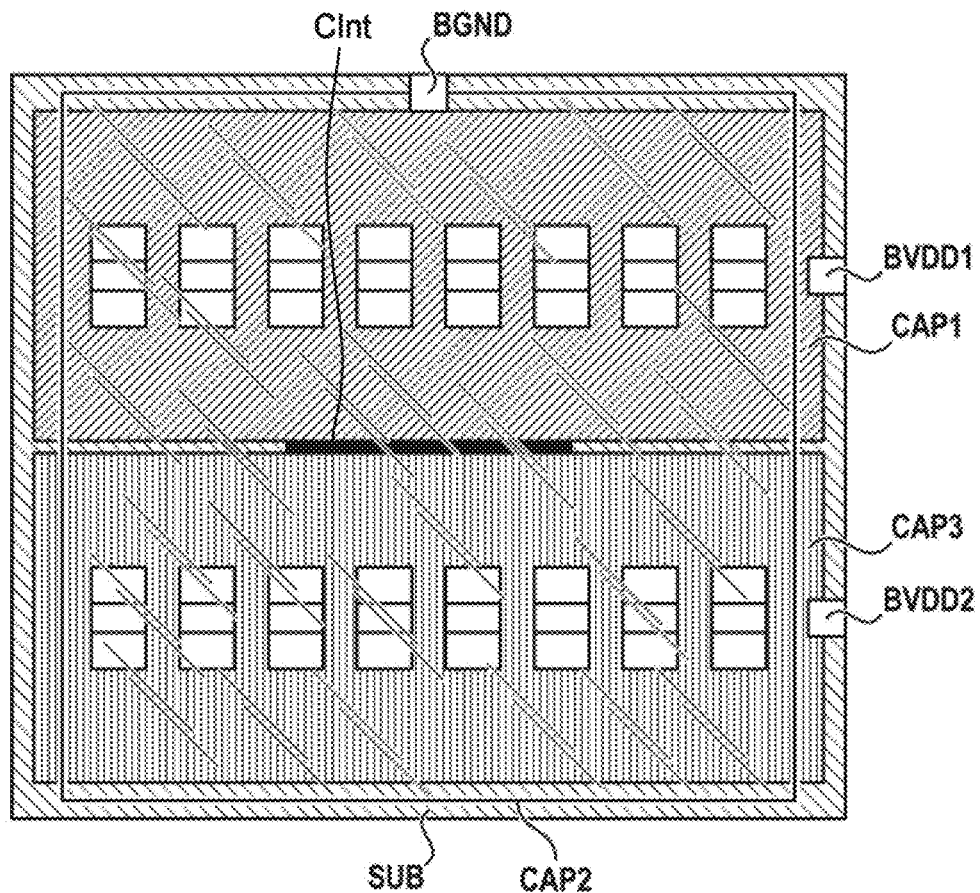
FIG. 13 shows another embodiment of the device according to the disclosure, comprising three covers.

FIGS. 12 and 13 show embodiments of the device of the disclosure wherein the device comprises three covers, a first cover CAP1, a second cover CAP2 and a third cover CAP3.

The first cover CAP1, the second cover CAP2 and the third cover CAP3 are made of metal.

The first cover CAP1, the second cover CAP2 and the third cover CAP3 are electrically insulated from one another.

The first cover CAP1 is connected to a first power supply terminal BVVD1 of the integrated circuit CInt. The first power supply terminal BVVD1 receives a first electric potential VDD1 from a first electric current power supply (not shown in FIGS. 12 and 13).

The third cover CAP3 is connected to a second power supply terminal BVVD2 of the integrated circuit CInt. The second power supply terminal BVVD2 receives a second electric potential VDD2 from a second electric current power supply (not shown in FIGS. 12 and 13).

In an embodiment the integrated circuit CInt comprises several power supply terminals that each receive the electric potential from one of the electric current power supplies. The same electric potential can be received by several power supply terminals of the integrated circuit CInt.

The second cover CAP2 is connected to a ground terminal BGND of the integrated circuit CInt. The ground terminal BGND of the integrated circuit CInt is connected to the common ground of the first electric current power supply and of the second electric current power supply.

The connection between the integrated circuit and the first cover CAP1 is carried out by a first power supply plane present on the substrate. This first plane also usually makes it possible to connect the first power supply of the integrated circuit CInt to another exterior device, for example to a board that supports the integrated circuit CInt (also known under the expression motherboard). The connection between the first cover CAP1 and the first power supply plane is done by brazing, or by gluing with a conductive glue. The first power supply plane is connected to the integrated circuit CInt via the use of metal alloy balls that allow for a surface mounting, these balls also known under the expression "bump."

The connection between the integrated circuit and the third cover CAP3 is carried out by a second power supply plane present on the substrate. This second plane also usually makes it possible to connect the second power supply of the integrated circuit CInt to another exterior device, for example to a board that supports the integrated circuit CInt (also known under the expression motherboard). The connection between the third cover CAP3 and the second power supply plane is done by brazing, or by gluing with a conductive glue. The second power supply plane is connected to the integrated circuit CInt via the use of metal alloy balls that allow for a surface mounting, these balls also known under the expression "bump."

The first electric potential VDD1 makes it possible to deliver a first voltage between the first power supply terminal BVDD1 and the ground BGND.

The second electric potential VDD2 makes it possible to deliver a second voltage between the second power supply terminal BVDD2 and the ground BGND.

The first cover CAP1, the second cover CAP2 and the third cover CAP3 are fastened to the substrate, generally by brazing or with electrically conductive adhesive paste.

The first cover CAP1 and the second cover CAP2 are connected together by a first capacitive connection.

The second cover CAP2 and the third cover CAP3 are connected together by a second capacitive connection.

These embodiments shown in FIGS. 12 and 13, therefore make it possible to regulate two independent voltages delivered, via two different electric potentials VDD1 and VDD2 to two current power supply terminals of the integrated circuit. The ground of the two voltages being identical for the two voltages.

In the embodiment shown in FIG. 12 the first cover CAP1, the second cover CAP2 and the third cover CAP3 are placed side-by-side. In this embodiment an upper portion of the first cover CAP1, an upper portion of the second cover CAP2 and an upper portion of the third cover CAP3 are located on the same plane substantially parallel to the substrate SUB. The upper portion of the first cover CAP1 is a portion of the first cover CAP1 that is the farthest away from the substrate SUB. The upper portion of the second cover CAP2 is a portion of the second cover CAP2 that is the farthest away from the substrate SUB. The upper portion of the third cover CAP3 is a portion of the third cover CAP3 that is the farthest away from the substrate SUB.

The side-by-side mounting of the first cover CAP1, of the second cover CAP2 and of the third cover CAP3 makes it possible to obtain a regulation device or an assembly comprising the substrate SUB, the integrated circuit CInt and the device for a finer regulation than with other montages.

The first capacitive connection is carried out by a first plurality of first capacitors COND1. A first terminal BCOND1-1 of the first capacitors COND1 is electrically connected to the first cover CAP1. A second terminal BCOND1-2 of the first capacitors COND1 is electrically connected to the first cover CAP2.

It is possible to connect the first terminal BCOND1-1 of the first capacitors COND1 to the first cover CAP1 and the second terminal BCOND1-2 of the first capacitors COND1 to the second cover CAP2 via the use of electrically conductive adhesive paste or by brazing.

The second capacitive connection is carried out by a second plurality of second capacitors COND2. A first terminal BCOND2-1 of the second capacitors COND2 is electrically connected to the third cover CAP3. A second terminal BCOND2-2 of the second capacitors COND2 is electrically connected to the second cover CAP2.

It is possible to connect the first terminal BCOND2-1 of the second capacitors COND2 to the third cover CAP3 and the second terminal BCOND2-2 of the second capacitors COND2 to the second cover CAP2 via the use of electrically conductive adhesive paste or by brazing.

In the embodiment shown in FIG. 13 the first cover CAP1 and the third cover CAP3 are placed side-by-side. In this embodiment an upper portion of the first cover CAP1 and an upper portion of the third cover CAP3 are located on the same plane substantially parallel to the substrate SUB. The upper portion of the first cover CAP1 is a portion of the first cover CAP1 that is the farthest away from the substrate SUB. The upper portion of the third cover CAP3 is a portion of the third cover CAP3 that is the farthest away from the substrate SUB.

The second cover CAP2 is placed above the first cover CAP1 and the third cover CAP3.

In this embodiment shown in FIG. 13 the first cover CAP1 and the third cover CAP3 are placed between the substrate SUB and the second cover CAP2.

The first capacitive connection between the first cover CAP1 and the second cover CAP2 is carried out according to embodiments of the capacitive connection shown in FIG. 5 or in FIG. 8.

The second capacitive connection between the third cover CAP3 and the second cover CAP2 is carried out according to embodiments of the capacitive connection shown in FIG. 5 or in FIG. 8.

Device for regulating a voltage of an electric current supplying an integrated circuit (CInt) resting on a substrate (SUB), the integrated circuit (CInt) comprising a ground terminal (BGND) and a power supply terminal (BVDD) able to receive the electric current may be summarized as including a first cover (CAP1) covering the integrated circuit (CInt),
a second cover (CAP2) covering the integrated circuit (CInt),
the first cover (CAP1) being electrically connected to the power supply terminal (BVDD) of the integrated circuit (CInt);
the second cover (CAP2) being electrically connected to the ground terminal (BGND) of the integrated circuit (CInt);
the first cover (CAP1) and the second cover (CAP2) being connected together by a capacitive connection.

An upper portion of the first cover (CAP1) and an upper portion of the second cover (CAP2) may be located on the same plane substantially parallel to the substrate (SUB);
the upper portion of the first cover (CAP1) may be a portion of the first cover (CAP1) that is the farthest away from the substrate (SUB) and
the upper portion of the second cover (CAP2) may be a portion of the second cover (CAP2) that is the farthest away from the substrate (SUB).

The second cover (CAP2) may be placed between the first cover (CAP1) and the substrate (SUB).

The first cover (CAP1) may be fastened to the substrate (SUB) on two first zones (Z1 and Z2) located at the edge of two parallel sides (C1 and C2) of the substrate (SUB) and
the second cover (CAP2) may be fastened to the substrate (SUB) on two second zones (Z2 and Z3) located at the edge of the two other sides (C3 and C4) of the substrate (SUB).

The first cover (CAP1) may be fastened to the substrate (SUB) on four first zones (Z1' to Z4') located at the edge of the four sides (C1 to C4) of the substrate (SUB) and
the second cover (CAP2) may be fastened to the substrate (SUB) on four second zones (Z1" to Z4") located between the integrated circuit (CInt) and the fastening zones (Z1' to Z4') of the first cover (CAP1).

The capacitive connection may include a dielectric material.

The capacitive connection may include a plurality of capacitors (COND) of the surface-mounted component type.

A first terminal (BCOND1) of each capacitor (COND) may be electrically connected with only one of the covers among the first cover (CAP1) or the second cover (CAP2)
a second terminal (BCOND2) of each capacitor (COND) may be electrically connected with only the other cover among the first cover (CAP1) or the second cover (CAP2).

The capacitors (COND) may be assembled with the first cover (CAP1) and the second cover (CAP2) by carrying out:
a step (601) of depositing at least one first zone (PCE1) of electrically conductive adhesive paste on an external face of the first cover (CAP1);
a step (602) of depositing at least one first zone (PNCE1) of electrically non-conductive adhesive paste on the first cover (CAP1);
a step (603) of positioning capacitors (COND) on the first cover (CAP1) in such a way that the first terminals (BCOND1) of the capacitors (COND) are positioned on the zone (PCE1) of electrically conductive adhesive paste and that the second terminals (BCOND2) of the capacitors (COND) are positioned on the zone (PNCE1) of electrically non-conductive adhesive paste;

a step (604) of depositing at least one second zone (PCE2) of electrically conductive adhesive paste on an internal face of the second cover (CAP2);

a step (605) of depositing at least one second zone (PNCE2) of electrically non-conductive adhesive paste on the internal face of the second cover (CAP2);

a step (606) of positioning the second cover (CAP2) above the first cover (CAP1) in such a way that the second zone (PNCE2) of electrically non-conductive adhesive paste is in contact with the first terminals (BCOND1) of the capacitors (COND) and the second zone (PCE2) of electrically conductive adhesive paste is in contact with the second terminals (BCOND2) of the capacitors (COND).

The device may be supplied by two voltages;

the integrated circuit (CInt) may include a first power supply terminal (BVDD1) and a second power supply terminal (BVDD2);

the device may include a first cover (CAP1) covering at least partially the integrated circuit (CInt), a second cover (CAP2) covering at least partially the integrated circuit (CInt), a third cover (CAP3) covering at least partially the integrated circuit (CInt), the first cover (CAP1) being electrically connected to the first power supply terminal (BVDD1) of the integrated circuit (CInt);

the second cover (CAP2) being electrically connected to the ground terminal (BGND) of the integrated circuit (CInt);

the third cover (CAP3) being electrically connected to the second power supply terminal (BVDD2) of the integrated circuit (CInt);

the first cover (CAP1) and the second cover (CAP2) being connected together by a first capacitive connection;

the second cover (CAP2) and the third cover (CAP3) being connected together by a second capacitive connection.

An upper portion of the first cover (CAP1), an upper portion of the second cover (CAP2) and an upper portion of the third cover (CAP3) may be located on the same plane substantially parallel to the substrate (SUB) or an upper portion of the first cover (CAP1) and an upper portion of the third cover (CAP3) may be located on the same plane substantially parallel to the substrate (SUB) and the first cover (CAP1) and the third cover (CAP3) may be placed between the substrate (SUB) and the second cover (CAP2);

the upper portion of the first cover (CAP1) may be a portion of the first cover (CAP1) that is the farthest away from the substrate (SUB);

the upper portion of the second cover (CAP2) may be a portion of the second cover (CAP2) that is the farthest away from the substrate (SUB);

the upper portion of the third cover (CAP3) may be a portion of the third cover (CAP3) that is the farthest away from the substrate (SUB).

The first capacitive connection may include a first plurality of first capacitors (COND1) of the surface-mounted component type;

the second capacitive connection may include a second plurality of second capacitors (COND2) of the surface-mounted component type;

a first terminal (BCOND1-1) of each first capacitor (COND1) may be electrically connected with only one of the covers among the first cover (CAP1) or the second cover (CAP2)

a second terminal (BCOND1-2) of each first capacitor (COND1) may be electrically connected with only the other cover among the first cover (CAP1) or the second cover (CAP2);

a first terminal (BCOND2-1) of each second capacitor (COND2) may be electrically connected with only one of the covers among the second cover (CAP2) or the third cover (CAP3);

a second terminal (BCOND2-2) of each second capacitor (COND2) may be electrically connected with only the other cover among the second cover (CAP2) or the third cover (CAP3).

Assembly may include a substrate (SUB), an integrated circuit (Cint) and device for regulating a voltage of an electric current supplying the integrated circuit.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:

a substrate;

an integrated circuit on the substrate;

a first cover covering the integrated circuit, the integrated circuit being positioned in a cavity formed by the first cover and the substrate; and a second cover covering the integrated circuit, the first cover and the second cover being capacitively coupled.

2. The device according to claim 1 wherein:

the integrated circuit including a first terminal and a second terminal, the first cover being coupled to the first terminal, the first cover being coupled to the integrated circuit, and the second cover being coupled to the second terminal, the second cover being coupled to the integrated circuit;

an upper portion of the first cover and an upper portion of the second cover are located on the same plane substantially parallel to the substrate;

the upper portion of the first cover is a portion of the first cover that is the farthest away from the substrate; and the upper portion of the second cover is a portion of the second cover that is the farthest away from the substrate.

3. The device according to claim 1 wherein:
the first cover is fastened to the substrate on two first zones located at an edge of two parallel sides of the substrate; and
the second cover is fastened to the substrate on two second zones located at an edge of two other sides of the substrate.

4. The device according to claim 1 wherein:
the first cover is fastened to the substrate on four first zones located at an edge of four sides of the substrate; and
the second cover is fastened to the substrate on four second zones located between the integrated circuit and the fastening zones of the first cover.

5. The device according to claim 1, further comprising a plurality of surface-mounted capacitors.

6. The device according to claim 5 wherein:
a first terminal of each capacitor is electrically coupled with only one of the covers among the first cover or the second cover; and
a second terminal of each capacitor is electrically coupled with only the other cover among the first cover or the second cover.

7. A device, comprising:
a substrate;
an integrated circuit that includes a first power supply terminal and a ground terminal, the integrated circuit being on a first side of the substrate;
a first cover covering at least partially the integrated circuit, the first cover being electrically coupled to the first power supply terminal of the integrated circuit; and
a second cover covering at least partially the integrated circuit, the first cover and the second cover coupled together by a first capacitive connection.

8. The device according to claim 7 comprising:
a third cover covering at least partially the integrated circuit, the third cover being electrically coupled to a second power supply terminal of the integrated circuit;
the second cover and the third cover being coupled together by a second capacitive connection; and
an upper portion of the first cover, an upper portion of the second cover, and an upper portion of the third cover are located on the same plane substantially parallel to the substrate; or
an upper portion of the first cover and an upper portion of the third cover are located on the same plane substantially parallel to the substrate and the first cover and the third cover are placed between the substrate and the second cover;
the upper portion of the first cover is a portion of the first cover that is the farthest away from the substrate;
the upper portion of the second cover is a portion of the second cover that is the farthest away from the substrate; and
the upper portion of the third cover is a portion of the third cover that is the farthest away from the substrate.

9. The device according to claim 7 wherein:
the first capacitive connection comprises a first plurality of first surface-mounted capacitors;
a second capacitive connection comprises a second plurality of second surface-mounted capacitors;
a first terminal of each first capacitor is electrically coupled with only one of the covers among the first cover or the second cover;
a second terminal of each first capacitor is electrically coupled with only the other cover among the first cover or the second cover;
a first terminal of each second capacitor is electrically coupled with only one of the covers among the second cover or a third cover; and
a second terminal of each second capacitor is electrically coupled with only the other cover among the second cover or the third cover.

10. A device, comprising:
a substrate;
an integrated circuit coupled to a first surface of the substrate;
a first cap electrically coupled to the substrate;
a second cap coupled to the substrate, the first cap and the second cap covering the integrated circuit; and
a plurality of first capacitors positioned in a space between the first cap and the second cap.

11. The device of claim 10 wherein the substrate has a first contact pad and a second contact pad on the first surface, the first cap coupled to the first contact pad and coupled to the second contact pad with a first dielectric support, the second cap coupled to the substrate by a second dielectric support and electrically coupled to the second contact pad, and the plurality of first capacitors includes:
a first capacitor having a first terminal coupled to the first cap and a second terminal coupled to the second cap;
a second capacitor having a first terminal coupled to the first cap and a second terminal coupled to the second cap, the first capacitor being closer to the second dielectric support than the second capacitor.

12. The device of claim 11 wherein the first terminal of the first capacitor has a first conductive end coupled to the first cap with a conducive adhesive and a second end coupled to the second cap with a non-conductive adhesive.

13. The device of claim 11 wherein the first cap is closer to the integrated circuit than the second cap, the first terminal of the first capacitor being closer to the integrated circuit than the second terminal of the first capacitor.

14. The device of claim 10 wherein the first cap covers a first portion of the integrated circuit and the second cap covers a second portion of the integrated circuit, the space being aligned between the first and second portions of the integrated circuit.

15. The device of claim 14 wherein the plurality of first capacitors includes a first capacitor that has a first terminal coupled to the first cap and a second terminal coupled to the second cap.

16. The device of claim 15, further comprising a third cap that is spaced from the first cap by the second cap.

17. The device of claim 16, further comprising a plurality of second capacitors are coupled between the second cap and the third cap.

18. The device according to claim 1 wherein the second cover is covering the first cover, the second cover being further from the integrated circuit than the first cover.

19. The device according to claim 7, wherein the second cover is electrically coupled to the ground terminal of the integrated circuit.

* * * * *